United States Patent [19]

King

[11] 4,388,731
[45] Jun. 14, 1983

[54] RECEIVER WITH SQUELCH FOR OFFSET CARRIER ENVIRONMENT

[75] Inventor: Dennis D. King, Marion, Iowa

[73] Assignee: Rockwell International Corporation, El Segundo, Calif.

[21] Appl. No.: 279,894

[22] Filed: Jul. 1, 1981

[51] Int. Cl.³ .............................................. H04B 1/10
[52] U.S. Cl. .................................. 455/221; 455/222; 455/225; 455/303; 455/312
[58] Field of Search .................................. 455/35-37, 455/212, 218, 221-225, 303, 306, 312

[56] References Cited

U.S. PATENT DOCUMENTS

| | | | |
|---|---|---|---|
| 3,126,449 | 3/1964 | Shirman | 455/221 |
| 3,325,738 | 6/1967 | Busby et al. | 455/218 |
| 3,337,808 | 8/1967 | Kahn | 455/222 |

FOREIGN PATENT DOCUMENTS 52-30310  3/1977  Japan .................................. 455/225

Primary Examiner—Jin F. Ng
Attorney, Agent, or Firm—Terry M. Blackwood; H. Fredrick Hamann

[57] ABSTRACT

A receiver with squelch capability includes squelch gate control circuitry which operates the squelch gate on the basis of substantially pure noise even in environments such as offset carrier networks which cause or create substantial interference energy in the receiver.

16 Claims, 2 Drawing Figures

RECEIVER WITH SQUELCH FOR OFFSET CARRIER ENVIRONMENT

This invention relates to radio receivers and to squelch systems.

Squelch systems are commonly employed in VHF and UHF receivers to suppress noise when little or no remote transmission is being received. More particularly, intelligence processing circuits, typically audio circuits, are turned on or off in accordance with excursions of a squelch drive signal across a threshold level. One of the most common receiver squelch systems presently in use, especially in the air transport industry, is the noise squelch system. This system takes the post-detection audio signal and, by filtering, splits same into two components, one above and one below a predetermined audio frequency $F_I$, where $F_I$ is typically 4 kHz. The components below $F_I$ are considered "signal" and the components above $F_I$ are considered "noise". The levels of these two components are compared and the result of such comparison is used to control a squelch gate. Such a system can be preset to operate at any desired signal-to-noise ratio.

Such noise squelch systems work satisfactorily in many applications but produce undesirable results when used in a crowded signal environment such as one of the offset carrier environments now employed in various parts of the world. The offset carrier network employed in the U.S.A. is called the ARINC CLIMAX network, and, in principle at least, is typical and representative of the other offset carrier networks employed in other countries. The CLIMAX network is a line of radio stations across the U.S.A. with all stations transmitting the same information. Each successive station's carrier frequency is typically offset from the preceding one by 5 kHz. The CLIMAX network thus permits a pilot to monitor the broadcasts all the way across the U.S.A. without changing frequencies. However, the typical noise squelch system interprets the offset carrier and resulting beat notes as noise and disables the receiver audio. In other words, due to offset-carrier-caused interference energy, the receiver is often disabled at a time when it should be enabled. As above mentioned, offset carrier networks in other countries are similar to the CLIMAX network but employ offsets other than 5 kHz. More particularly, the offset-carrier-caused interference energy can presently be anywhere from 4 kHz to 16 kHz.

In accordance with the present invention, there is featured the provision of a squelch system having greatly enhanced immunity to offset-carrier-caused muting. Other features, objects and advantages of the invention will become more apparent upon reference to the following specification, claims and appended drawings in which FIG. 1 is a block diagram schematic representing a receiving system including the presently preferred embodiment of this invention, and FIG. 2 is a circuit schematic showing parts of the FIG. 1 apparatus in more detail.

DETAILED DESCRIPTION OF THE PREFERRED EMBODIMENT

As briefly mentioned above, the ARINC CLIMAX network comprises a line of radio stations wherein each successive station carrier is offset from the preceding station carrier by, typically, five kHz. A problem condition, namely undesired receiver quieting, often arises when using a conventional noise squelch in such an environment.

A primary reason for such problem is that a 5 kHz beat note is created in the receiver, usually in the detector which outputs the audio intelligence. A further contributor to the problem is a second harmonic at 10 kHz also created by the receiver. A conventional noise squelch system interprets these offset-carrier-caused interference notes as noise and disables the receiver audio. The problem is so acute that when two stations are within 40 dB of the same strength, the receiver is often disabled. When all the various networks throughout the world are considered, the problem becomes even more complex. Currently, the various known networks employ offset frequency values from 4 kHz to 8 kHz and thus the offset-carrier-caused interference energy can appear practically anywhere in the range of approximately 4 kHz to approximately 16 kHz.

Figure 1:
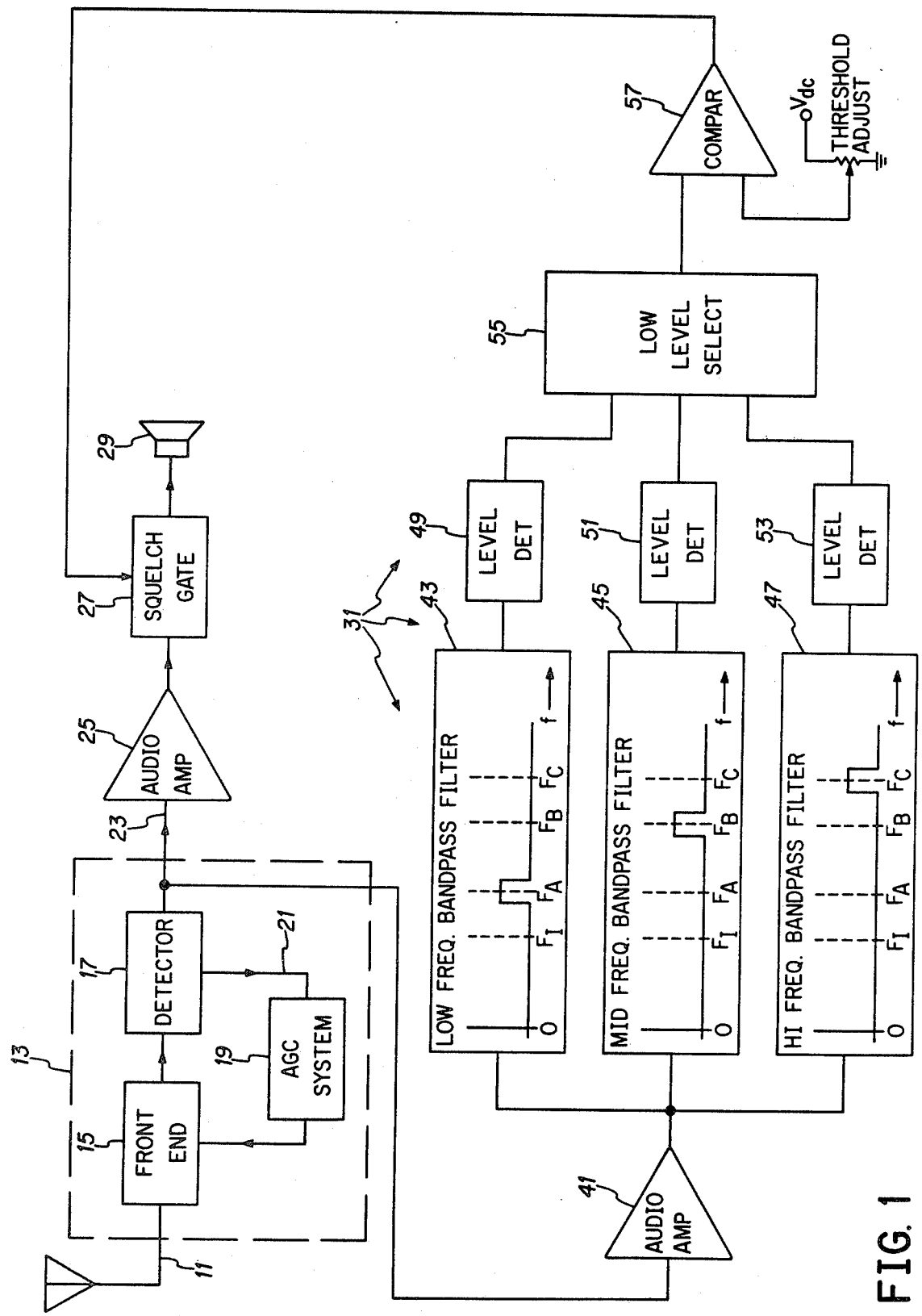

FIG. 1 represents a receiver in which immunity to offset-carrier-caused muting has been substantially enhanced. Since the illustrated receiver embodiment bears many similarities to conventional prior art receivers (for instance see U.S. Pat. No. 3,188,571 assigned to the assignee hereof), the following description will set forth only a brief summary of the well-known and understood receiver portions.

Briefly, then, an incoming remote transmission 11 is fed through demodulator means 13 which includes a receiver front end 15 and a detector 17. An AGC system 19 employs part of detector output 21 to derive feedback for controlling the gain of an amplifier or amplifiers in front end 15. Front end 15 preferably comprises an RF amplifier, a mixer, an oscillator, and one or more IF amplifiers. The detector 17 is usually a diode type AM detector. Other choices, appropriate for the type of transmission being received, will be apparent to those skilled in the art; what is important is that the demodulator recover the intelligence originally impressed on the RF transmission.

In the preferred embodiment, the recovered intelligence is a voice frequency waveform and the demodulator output 23, which comprises detected audio, is connected to an audio channel containing one or more amplifiers 25, a squelch gate 27, and a speaker or headset 29. Squelch gate 27, as controlled by the squelch system, enables or disables speaker 29.

In accordance with the presently preferred inventive embodiment, there is connected between demodulator 13 and squelch gate 27 a squelch system 31 which employs three different bandpass filters and a selection thereamong whereby the lowest energy level of the three controls the squelch gate. More particularly, the detected audio at demodulator output 23 is provided, through an audio amplifier 41, to each of three parallel connected channels. Each channel comprises a different one of three different bandpass filters, 43, 45, and 47 followed by a different one of three similar average level detectors 49, 51, and 53. The outputs of level detectors 49, 51, and 53 are input to selector 55 which steers the lowest level of the three to the input of comparator 57. If this input to comparator 57 is greater than a predetermined threshold, the comparator output commands the squelch gate 27 to a receiver-disable condition and quiets or mutes the receiver. If the input to comparator 57 is less than the predetermined threshold, the comparator output commands the squelch gate to a receiver-enable condition and thereby removes the quieting.

The passbands of the three filters 43, 45, and 47 have three different center frequencies, namely, as denoted in FIG. 1, $F_A$, $F_B$, and $F_C$, respectively. In the preferred embodiment, the intelligence is voice information and thus intelligence energy, when present, predominates the lower end of the audio spectrum, or more particularly, the approximate range of zero Hz to $F_I$, where $F_I$ is typically about 4 kHz. Each of $F_A$, $F_B$, and $F_C$ is located in the part of the audio spectrum adjacent the intelligence part of the audio spectrum. That is, each of $F_A$, $F_B$, and $F_C$ is located in the audio spectrum part adjacent the zero Hz to $F_I$ range. The values for $F_A$, $F_B$, and $F_C$ have been chosen so that, whichever one of the world's currently most common offset carrier networks the receiver may be operating in, at least one of the three filters will, practically all the time, monitor relatively pure noise uncontaminated by offset carrier interference energy.

In the presently preferred embodiment, $F_A$ is 6 kHz, $F_B$ is 9 kHz, and $F_C$ is 11 kHz. For each of the three filters, attenuation increases on either side of its center frequency. More particularly, for filter 43, within the range of about 6 kHz±1 kHz, transmittance is greater than 50 percent of the transmittance at 6 kHz and is below 50 percent outside this range. For filter 45, within the range of about 9 kHz±1.4 kHz, transmittance is greater than 50 percent of transmittance at 9 kHz and is below 50 percent outside this range. For filter 47, within the range of about 11 kHz±1.4 kHz, transmittance is greater than 50 percent of transmittance at 11 kHz and is below 50 percent outside this range. The widths of the passbands are related to one another so that, when the receiver is operating in a pure noise environment (i.e., without intelligence carriers or interference causing carriers), all three channels produce substantially the same levels at the inputs to selector 55.

When the receiver is operating in a pure noise environment (i.e., an environment where no carriers are present) the demodulator output 23 will contain only noise throughout its audio bandwidth, which is about zero to 16 kHz. Under these conditions, each of the three bandpass filters will contain only noise and each of the three channels will produce practically the same high level at the inputs to selector 55. The selected level, although the lowest one of the three, will nevertheless be high and cause the comparator to command the squelch gate to a quieting condition.

When a single intelligence carrier plus noise is present, the demodulator output 23 will contain intelligence energy in the part of the audio spectrum ranging from about zero to 4 kHz and will comprise primarily uncontaminated noise energy in the part of the audio spectrum from about 4 to 16 kHz. Under these conditions, each of the three bandpass filters will again contain only noise and each of the three channels will produce practically equal levels at the inputs to selector 55. However, due to the action of the AGC, each level will be a low level. Thus, the selected level will be low and cause the comparator to command the squelch gate to a receiver-enable condition.

When two carriers plus noise are present, the demodulator output 23 will contain intelligence energy in the part of the audio spectrum ranging from about zero to 4 kHz, will contain noise in the part of the spectrum ranging from about 4 to 16 kHz, and will also contain interference energy somewhere in the range of about 4 to 16 kHz. This interference energy may pass through one or possibly two of the three bandpass filters, causing their respective level detectors to indicate energy content above the noise level. Meanwhile, the remaining bandpass filter will contain only noise. Since this remaining channel contains the lowest energy, its level is used to determine the receiver noise content and to operate the squelch gate. More particularly, due to the action of the AGC, the selected level will be low and will thus cause the comparator to command the squelch gate to a receiver-enable condition.

In this way, the squelch system permits proper squelch performance even with two carriers present. Analysis has shown that the chosen center frequencies of 6, 9, and 11 kHz for the three filters nearly always results in proper squelch operation even in the presence of three equal level offset carrier signals which, it has been determined, is a rather unlikely event.

Figure 2:
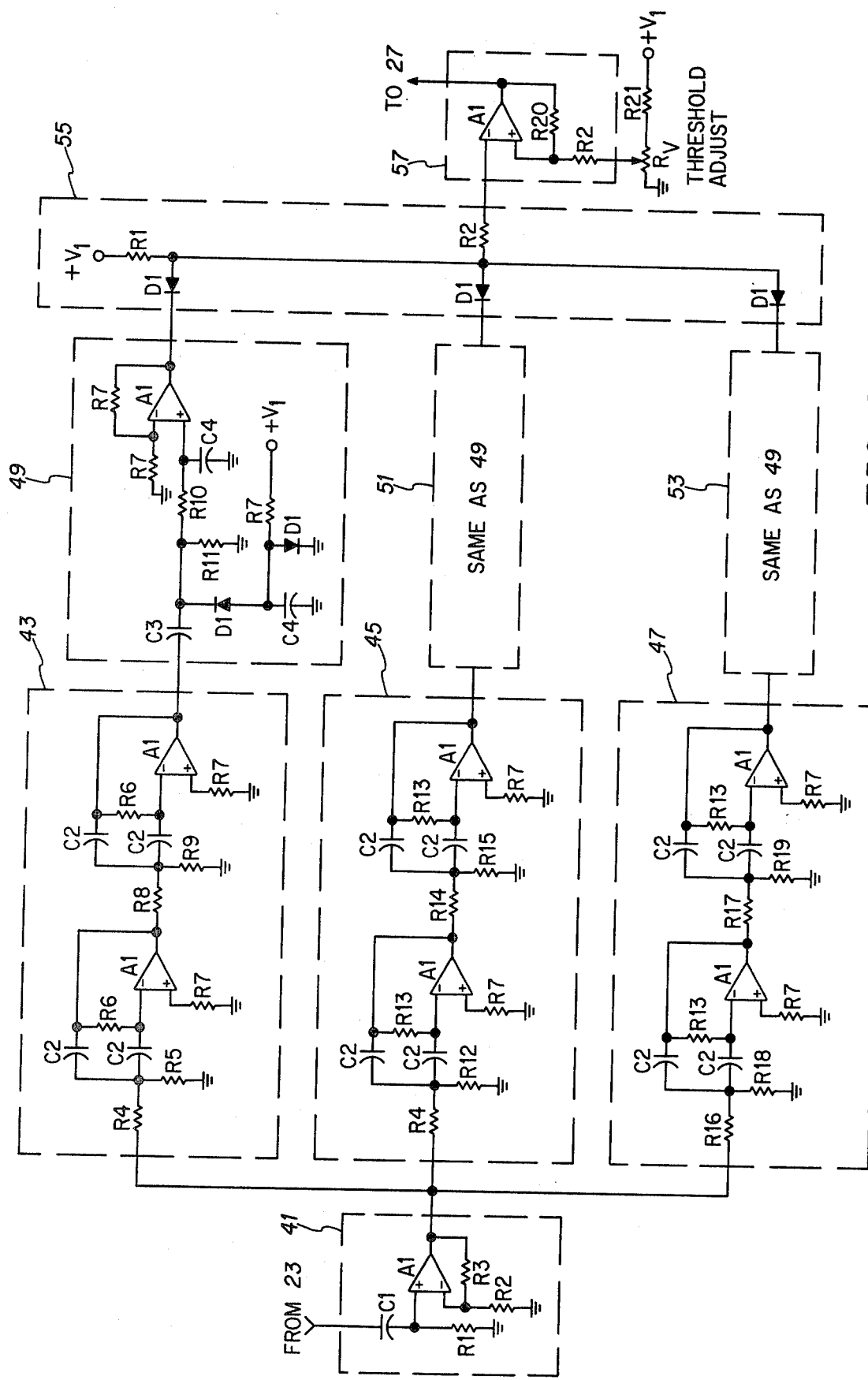

Turning now to FIG. 2, therein is shown the presently preferred squelch system in greater detail. More particularly, each bandpass filter comprises two cascaded, two-pole bandpass filters. Each level detector comprises a diode detector and an associated DC level amplifier. Selector 55 comprises three diodes whose cathodes receive the three level detector outputs and whose anodes are connected together, and to a positive voltage, and to the input of comparator 57. The filters, the level detectors, the audio amplifier and the comparator each comprise conventional and well-known operational amplifier circuits. Precision resistors (1 percent) and capacitors (2 percent) are used in the bandpass filters to eliminate tuning adjustments and to ensure good operation over temperature.

For further detail, the presently employed components are further specified below. The values of resistors R1, R2, R3, R4, R5, R6, R7, R8, R9, R10, R11, R12, R13, R14, R15, R16, R17, R18, R19, R20, and R21 are, respectively, 47 kohms, 27 kohms, 100 kohms, 90.9 kohms, 1.02 kohms, 536 kohms, 10 kohms, 180 kohms, 1.18 kohms, 2.2 kohms, 3300 ohms, 1.1 kohms, 237 kohms, 68 kohms, 1.21 kohms, 70.8 kohms, 68 kohms, 237 kohms, 665 ohms, 470 kohms, and 10 kohms. $R_v$ is a 10 kohm potentiometer. The values of capacitors C1, C2, C3, and C4 are, respectively, 0.1 microfarads, 1000 picofarads, 1.0 microfarads, and 6.8 microfarads. Each diode D1 is a 1N4454. $+V_1$ is $+12$ volts dc. Each amplifier A1 is a type 741 op-amp.

It is contemplated that a system with fewer than three passbands, could, in several locales still provide substantial immunity to false quieting. It is presently contemplated that one such system might comprise the above illustrated system minus the middle frequency bandpass channel. Other various modifications, some examples of which are set out below, may be made without departing from the inventive teachings herein. For example, the input to the squelch system need not be detected audio. Similar audio information would be available in the pre-detection part of the demodulator 13 but would still appear as modulation on some carrier frequency such as an IF carrier frequency. With proper modification to the bandpass filters to relocate their passbands, or by adding a separate detector at the squelch system input, a non-zero carrier frequency AM'ed with the audio information could be used as the input to the squelch system.

It is also presently contemplated that the high frequency bandpass filter could be replaced with a highpass filter which, like the bandpass filter, substantially suppresses frequencies between zero and about 9.6 kHz and substantially passes frequencies between about 9.6 and 12.4 kHz, but which, unlike the bandpass filter, substantially passes, rather than substantially suppresses, frequencies above about 12.4 kHz.

Moreover, more than three passbands may one day be useful as more locales adopt offset carrier networks with new and different offsets. Also, it may be desirable to change the passband locations and/or the number of passbands as various present locales change or standardize their offsets.

Thus, while particular embodiments of the present invention have been shown and/or described, it is apparent that changes and modifications may be made therein without departing from the invention in its broader aspects. The aim of the appended claims, therefore, is to cover all such changes and modifications as fall within the true spirit and scope of the invention.

What is claimed is:

1. A receiver comprising:
    demodulator means;
    demodulator intelligence processing means including gating means, and
    squelch circuit means connected for receiving an input $e_d(t)$ from the demodulator means, $e_d(t)$ containing noise energy, and, possibly, intelligence energy, and interference energy said squelch circuit means further connected for controlling said gating means and comprising:
    (a) first means for monitoring the energy content in each of a plurality N of different fixed portions of the part of the $e_d(t)$ spectrum adjacent the part of the $e_d(t)$ spectrum normally predominated by intelligence energy when intelligence is present in $e_d(t)$,
    (b) second means, responsive to said first means, for selecting the portion containing the least energy, and
    (c) third means, responsive to said second means, for (i) controlling said gating means to a receiver-enable condition when the energy in the selected portion is below a predetermined threshold, and (ii) controlling said gating means to a receiver-quieting condition when the energy in the selected portion is above said predetermined threshold.

2. A receiver as defined in claim 1 wherein the N portions are located so that, when said receiver is operating in an offset carrier environment, there is a low likelihood of all N portions simultaneously containing substantial offset carrier interference energy.

3. A receiver as defined in claim 2 wherein said first means comprises a plural number of frequency selective channels, the number of channels being equal to N, said N channels being connected for operating in parallel, each said channel for monitoring a different one of the N portions of the $e_d(t)$ spectrum.

4. A receiver as defined in claim 3 wherein $N \geq 3$.

5. A receiver as defined in claim 3 wherein the (N−1) channels which monitor the (N−1) portions nearest the intelligence part of the $e_d(t)$ spectrum each comprise a different bandpass filter.

6. A receiver as defined in claim 5 wherein the channel which monitors the portion farthest from the intelligence part of the $e_d(t)$ spectrum also comprises a bandpass filter.

7. A receiver as defined in claim 1, 2, or 3 wherein the energy contained in $e_d(t)$ is audio frequency energy.

8. A receiver as defined in claim 2 or 3 wherein one of the N portions is a first passband having (i) a central frequency $f_1$ and (ii) a width no greater than approximately 2.8 kHz, $f_1$ being related to a reference frequency $f_r$ such that $|f_1 - f_r|$ is approximately equal to a predetermined one of 6 kHz, 9 kHz, or 11 kHz, $f_r$ being a predetermined one of (i) the carrier frequency of the intelligence of $e_d(t)$ or (ii) zero Hz.

9. A receiver as defined in claim 8 wherein a second one of the N portions is a second passband having (i) a central frequency $f_2$ and (ii) a width no greater than approximately 2.8 kHz, $f_2$ being related to reference frequency $f_r$ such that $|f_2 - f_r|$ is approximately equal to a different predetermined one of 6 kHz, 9 kHz, or 11 kHz.

10. A receiver as defined in claim 9 wherein a predetermined one of said first or second passbands has a central frequency which differs from $f_r$ by approximately 6 kHz, and such predetermined passband has a width which is no greater than approximately 2.0 kHz.

11. A receiver as defined in claim 9 wherein $N \geq 3$ and wherein a third one of the N portions is a third passband having (i) a central frequency $f_3$ and (ii) a width no greater than approximately 2.8 kHz, $f_3$ being related to $f_r$ such that $|f_3 - f_r|$ is approximately equal to the remaining one of 6 kHz, 9 kHz, or 11 kHz.

12. A receiver as defined in claim 11 wherein a predetermined one of said first, second, and third passbands has a central frequency which differs from $f_r$ by approximately 6 kHz, and such predetermined passband has a width which is no greater than approximately 2.0 kHz.

13. A receiver as defined in claim 1 wherein said first means comprises N filters connected for operating in parallel and for receiving audio frequency energy, one of said N filters comprising a bandpass first filter which (i) substantially passes energy in an audio frequency range of approximately (6 kHz − $\Delta f_1$) to (6 kHz + $\Delta f_1$) where $\Delta f_1$ is a frequency no greater than about 1 kHz, and (ii) substantially suppresses energy elsewhere in an audio frequency range of approximately zero to 16 kHz.

14. A receiver as defined in claim 13 wherein a further one of said N filters comprises a second filter which (i) substantially suppresses energy in an audio frequency range of approximately zero to (11 kHz − $\Delta f_2$) and (ii) substantially passes energy in an audio frequency range of approximately (11 kHz − $\Delta f_2$) to (11 kHz + $\Delta f_2$), where $\Delta f_2$ is a frequency no greater than about 1.4 kHz.

15. A receiver as defined in claim 14 wherein a yet further one of said N filters comprises a third filter which (i) substantially passes energy in an audio frequency range of approximately (9 kHz − $\Delta f_3$) to (9 kHz + $\Delta f_3$), where $\Delta f_3$ is a frequency no greater than about 1.4 kHz, and (ii) substantially suppresses energy elsewhere in a range of approximately zero to 16 kHz.

16. A receiver as defined in claim 15 wherein said second filter substantially suppresses energy in a frequency range of approximately (11 kHz + $\Delta f_2$) to 16 kHz.

* * * * *